United States Patent
Han et al.

(10) Patent No.: US 8,200,057 B2
(45) Date of Patent: Jun. 12, 2012

(54) SINGLE-MODE FIBER AND PRODUCTION METHOD THEREOF

(75) Inventors: Qingrong Han, Wuhan (CN); Chen Yang, Wuhan (CN); Jing Li, Wuhan (CN); Jie Luo, Wuhan (CN)

(73) Assignee: Yangtze Optical Fibre and Cable Company, Ltd., Wuhan (CN)

( * ) Notice: Subject to any disclaimer, the term of this patent is extended or adjusted under 35 U.S.C. 154(b) by 174 days.

(21) Appl. No.: 12/839,432

(22) Filed: Jul. 20, 2010

(65) Prior Publication Data

US 2011/0058780 A1 Mar. 10, 2011

Related U.S. Application Data

(63) Continuation of application No. PCT/CN2010/070766, filed on Feb. 26, 2010.

(30) Foreign Application Priority Data

Jun. 26, 2009 (CN) .......................... 2009 1 0062855

(51) Int. Cl.
*G02B 6/036* (2006.01)
(52) U.S. Cl. ............. 385/127; 385/124; 65/391; 65/397
(58) Field of Classification Search .......... 385/124–127; 65/391, 398–400
See application file for complete search history.

(56) References Cited

U.S. PATENT DOCUMENTS

| | | | | |
|---|---|---|---|---|
| 6,697,559 B2* | 2/2004 | Hirano et al. | ................. | 385/127 |
| 2001/0043782 A1* | 11/2001 | Yokoyama et al. | ........... | 385/127 |
| 2002/0097970 A1* | 7/2002 | Sasaoka | ........................ | 385/123 |
| 2003/0138229 A1* | 7/2003 | Paek et al. | ..................... | 385/123 |

* cited by examiner

*Primary Examiner* — Ellen Kim
(74) *Attorney, Agent, or Firm* — Matthias Scholl P.C.; Matthias Scholl

(57) ABSTRACT

A single mode fiber having a core, an inner cladding, a depressed cladding, and an outer cladding composed of pure silica glass. The core is surrounded in sequence with the inner cladding and the depressed cladding. The core has silica glass doped with germanium and fluorine, with a diameter (a) of 8.0-8.8 μm, a relative refractive index difference ($\Delta_1$) of 0.35-0.38%, and the contribution of fluoride ($\Delta_F$) is –0.09±0.02%. The inner cladding has silica glass doped with germanium and fluorine, with a diameter (b) of 18-21 μm and a relative refractive index difference ($\Delta_2$) of 0±0.02%. The depressed cladding has silica glass doped with fluorine, with a diameter (c) of 26-36 μm and a relative refractive index difference ($\Delta_{32}$) at the external interface thereof is between –0.22 and –0.35%, and a relative refractive index difference ($\Delta_{31}$) at the internal interface thereof is between –0.20 and –0.35%, and $\Delta_{32} \leq \Delta_{31}$. The fiber has a good bending resistance, good mechanical properties, and extended service lifetime, and prevents the additional stresses generated by bending from passing on to the core, thereby reducing attenuation.

18 Claims, 4 Drawing Sheets

SINGLE-MODE FIBER AND PRODUCTION METHOD THEREOF

CROSS-REFERENCE TO RELATED APPLICATIONS

This application is a continuation of International Patent Application No. PCT/CN2010/070766 with an international filing date of Feb. 26, 2010, designating the United States, now pending, and further claims priority benefits to Chinese Patent Application No. 200910062855.6 filed Jun. 26, 2009. The contents of all of the aforementioned applications, including any intervening amendments thereto, are incorporated herein by reference.

BACKGROUND OF THE INVENTION

1. Field of the Invention

The invention relates to the field of optical communication, and more particularly to a single mode fiber suitable for access network or long wavelength application and a method for producing the same. The fiber has excellent bending resistance and moderate effective area.

2. Description of the Related Art

In recent years, FTTx has become a hot topic in the field of fiber network construction and fibers suitable for FTTx have been widely studied. Low water peak single mode fibers insensitive to bending are popular. Conventional low water peak single mode fibers (in accordance with ITU-TG.652C/D) have a bending radius of 30 mm, so the use thereof in indoor and narrow environments is greatly restricted. When a long fiber is wrapped in a small storage box, it is exposed to great bending stresses. To meet the requirements of the FTTx network construction and apparatus miniaturization, bending resistant fibers are desired. In December 2006, ITU-T announced a new fiber standard (G.657 fibers): "Characteristics of a bending loss insensitive single mode optical fiber and cable for the access network". Thus, to develop a bending resistant single mode fiber is of immense significance for promoting the development of optical fiber access technology.

It is well-known that the macro-bend loss of fibers is mainly related to the mode field diameter and cutoff wavelength thereof. Bending properties of fibers can be represented by an MAC value, which is defined as a ratio of mode field diameter at 1,550 nm wavelength to cutoff wavelength. The smaller the MAC value, the better the bending properties of fibers. Obviously, to reduce the mode field diameter or increase the cutoff wavelength can decrease the MAC value, which is achieved by slightly modifying the parameters of conventional matched-cladding single mode fibers (as shown in FIG. 1). US2007/007016A1, CN1971321A, and CN1942793A disclose the method. However, if the mode field diameter is too small, the splicing loss will be large when connecting to conventional single mode fibers and the launched power is limited. Meanwhile, considering the characteristics of FTTx, in order to transmit with the whole band, the cutoff wavelength should not exceed 1,260 nm. Thus, the increase of the cutoff wavelength is very limited. Numerical aperture (NA) can be increased by higher doping, but high doping causes the increase of attenuation. Therefore, the method is not good.

Another method to improve bending properties of fibers is to design a depressed cladding (as shown in FIG. 2), as disclosed in U.S. Pat. No. 5,032,001, U.S. Pat. No. 7,043,125B2, and CN176680. The design increases the numerical aperture (NA) of fibers without increasing the doping, thereby preventing the increase of attenuation. A better method to improve bending properties of fibers is to design a depressed outer cladding (as shown in FIG. 3), whose basic waveguide structure is disclosed in U.S. Pat. No. 4,852,968, U.S. Pat. No. 6,535,679B2, and CN1982928A. However, these documents only aim at reducing additional bending loss, not considering the long-term service life of fibers under small bending radius. In fiber links, particularly in FTTx links, due to multi-point bending and connectors, multi-path interference (MPI) is a common phenomenon. The measurement of MPI was disclosed by David Z.hen in 2009 at OFC/NFOEC ("Testing MPI Threshold in Bend Insensitive Fiber Using Coherent Peak-To-Peak Power Method"). The depressed outer cladding should be designed accurately, if too close to the core, once the core deviates at the fiber connection point, the MPI easily occurs; if too far from the core, the additional bending loss cannot be decreased.

When a fiber bends, the outside thereof is exposed to the tensile stress. The tensile stress is represented by the following formula:

$$\sigma = \frac{E \cdot r}{(R + C_{th} + r)}$$

wherein E represents young modulus of silica glass, R represents a bending radius, r represents the radius of a fiber, and $C_{th}$ represents the thickness of a coating. Based on the formula and the bending radius, the tensile stress imposed on a fiber with a glass cladding diameter of 125 μm and an outer diameter of 250 μm is calculated, as shown in FIG. 4. For example, when the bending radius is decreased to 6.5 mm, the tensile stress imposed on the outer bending wall of the fiber is 0.69 GPa (100 kpsi), which reaches the common screentest tension of fibers. Bending easily causes fracture, thereby increasing the building and maintenance cost and affects the reliability of systems. Upon preparing a fiber or a preform, to achieve an expected refractive index profile so that when refractive index changes, the material compositions vary accordingly, different layers should have different thermal expansion coefficient, heat capacity, and glass transition temperature. In the process of fiber drawing, because of different heating and cooling rate, the residual stress is inevitably produced. The stress originated from different glass transition temperature is something like mechanical stress, which is temporary and can be removed by improving the fiber drawing process. The stress originated from different thermal expansion coefficient is permanent stress, which is hardly removed by improving fiber drawing process, but can be removed by designing appropriate material composition and structure. The appendix of fiber standard ITU-TG.657 briefly describes the prediction of fiber life. The service life of fibers is related to the dynamic stress corrosion susceptibility parameter ($n_d$) thereof. Under identical bending radius and storage length, the higher the $n_d$ of fibers, the higher the mechanical reliability thereof. Thus, it is urgent to develop a full-solid fiber that meets the standards G.652 and G.657 and has low additional bending loss, stable mechanical properties, and uniform material composition.

SUMMARY OF THE INVENTION

To describe the invention, technical terms involved are defined below:

"Core rod" refers to a preform comprising a core and some claddings coated thereon.

"Refractive index profile" refers to the relation between the glass refractive index of a fiber or a preform (such as mandrel) and the radius thereof.

"Relative refractive index difference" is defined by the following formula:

$$\Delta \% = [(n_i^2 - n_0^2)/2n_i^2] \times 100\% \approx \frac{n_i - n_0}{n_0} \times 100\%,$$

wherein $n_i$ and $n_0$ represent the glass refractive index of a material and pure silica, respectively.

"The contribution of fluoride" refers to the relative refractive index difference ($\Delta_F$) between a fluoride-doped silica glass and a pure silica glass, representing the addition amount of fluoride.

"The contribution of germanium" refers to the relative refractive index difference ($\Delta_{Ge}$) between a germanium-doped silica glass and a pure silica glass, representing the addition amount of germanium.

"Jacketing" refers to a pure silica glass tube with appropriate geometry structure and cross-sectional area.

"RIT process" refers to inserting a core rod into a jacketing tube to form a preform.

"OVD outer cladding deposition process" refers to coat $SiO_2$ glass on a core rod to a desired thickness using external vapor deposition and sintering processes.

"VAD outer cladding deposition process" refers to coat $SiO_2$ glass on a core rod to a desired thickness using axial vapor deposition and sintering processes.

"APVD outer cladding process" refers to coat $SiO_2$ glass on a core rod to a desired thickness with natural or synthetic quartz powder using high frequency plasma flame.

"O/Si ratio" refers to the molar ratio of oxygen to silicon tetrachloride aerated in the process of PCVD.

In view of the above-described problems, it is objectives of the invention to provide a single mode fiber that features practicable material composition and structure, high mechanical reliability, long service life, and good bending resistance, as well as to provide a method for producing the same.

To achieve the above objectives, in accordance with one embodiment of the invention, there is provided a single mode fiber, comprising: a core, an inner cladding, a depressed cladding, and an outer cladding composed of pure silica glass, wherein the core is surrounded in sequence with the inner cladding and the depressed cladding; the core comprises silica glass doped with germanium and fluorine, with a diameter (a) of 8.0-8.8 μm, a relative refractive index difference ($\Delta_1$) of 0.35-0.38%, and the contribution of fluoride ($\Delta_F$) is −0.09±0.02%; the inner cladding comprises silica glass doped with germanium and fluorine, with a diameter (b) of 18-21 μm and a relative refractive index difference ($\Delta_2$) of 0±0.02%; the depressed cladding comprises silica glass doped with fluorine, with a diameter (c) of 26-36 μm and a relative refractive index difference ($\Delta_{32}$) at the external interface thereof (32) (a starting point of depositing the depressed outer cladding) is between −0.22 and −0.35%, and a relative refractive index difference ($\Delta_{31}$) at the internal interface thereof (31) (an end point of depositing the depressed outer cladding) is between −0.20 and −0.35%, and $\Delta_{32} \leq \Delta_{31}$.

In a class of this embodiment, the material composition of the silica glass doped with germanium and fluorine is $SiO_2$—$GeO_2$—F—Cl, and that of the silica glass doped with fluorine is $SiO_2$—F—Cl.

In a class of this embodiment, the introduced chlorine originates from the reaction between silicon tetrachloride ($SiCl_4$) and/or germanium tetrachloride ($GeCl_4$) and oxygen. The fluctuation of chlorine content has little influence on the properties of the fiber. Actually, the chlorine content has little fluctuation under stable process conditions. Thus, there is no specific control and requirement on the chlorine content.

In a class of this embodiment, in the inner cladding, the amount of doped fluorine and germanium is on the increase gradually from the outer interface to the inner interface, exhibiting a gradient change; the contribution of fluorine of the outer interface of the inner cladding is −0.10±0.01%; the contribution of fluorine of the inner interface of the inner cladding is −0.16±0.01%.

In a class of this embodiment, the contribution of fluorine of the outer interface of the inner cladding (31) (a starting point of depositing the inner cladding) is −0.10±0.01%; the contribution of fluorine of the inner interface of the inner cladding (21) (an end point of depositing the inner cladding) is −0.16±0.01%.

In a class of this embodiment, the outer cladding has a diameter (d) of 78-126 μm.

In a class of this embodiment, a mode field diameter of the fiber at a wavelength of 1310 nm is 8.5-9.3 μm; a zero dispersion wavelength thereof is 1302-1322 nm; a dispersion slope thereof at the zero dispersion wavelength is less than or equal to 0.090 ps/nm²·km.

In a class of this embodiment, an attenuation coefficient of the fiber at 1310 nm is less than or equal to 0.344 dB/km, at 1383 nm (after hydrogen-aging) less than or equal to 0.334 dB/km, at 1550 nm less than or equal to 0.214 dB/km, at 1625 nm less than or equal to 0.224 dB/km, and at 1675 nm less than or equal to 0.284 dB/km.

In a class of this embodiment, a cutoff wavelength of the fiber is less than or equal to 1260 nm; at 1625 nm, an additional bending loss of the fiber after surrounding a 10 mm bending radius once is less than or equal to 0.2 dB or even less than or equal to 0.1 dB; an additional bending loss of the fiber after surrounding a 7.5 mm bending radius once is less than or equal to 0.5 dB or even less than or equal to 0.2 dB; an additional bending loss of the fiber after surrounding a 5 mm bending radius once is less than or equal to 1.0 dB or even less than or equal to 0.5 dB.

A method for producing a single mode fiber comprises the steps of: a) fixing a pure silica glass substrate tube in a plasma enhanced chemical vapor deposition (PCVD) lathe; b) in the presence of silicon tetrachloride and oxygen, aerating a fluorine-containing gas to dope fluorine and germanium tetrachloride to dope germanium; c) ionizing the gas in the substrate tube with microwave into plasma and depositing the plasma in the form of glass on the inner wall of the substrate tube; d) altering the dopant gas flow according to the doping requirements of optical waveguide structure and depositing a depressed cladding, an inner cladding, and a core in sequence; e) melting the depositing tube into a solid core rod with a furnace; f) preparing a fiber preform using RIT process with silica glass as a jacketing tube, or using OVD, VAD, or APVD process by depositing an outer cladding surrounding the solid core rod; g) drawing the fiber preform in a fiber drawing tower and coating two layers of UV-cured acrylic resin polymer on the surface of the fiber.

In a class of this embodiment, the fluorine-containing gas is $C_2F_6$, $CF_4$, $SiF_4$, $C_4F_8$, $SF_6$, or a mixture thereof.

In a class of this embodiment, in the process of depositing the depressed cladding, the furnace temperature is controlled at 1,080-1,120° C., the O/Si ratio is 3.0-3.5, and the chlorine content is less than 2,500 ppm.

In a class of this embodiment, in the process of depositing the inner cladding and the core, the furnace temperature is controlled at 1,000-1,050° C., the O/Si ratio is 2.2-2.6, and the chlorine content is 3,500-4,200 ppm.

The doped chlorine has little influence on Rayleigh scattering of silica glass, but increases the refractive index and lowers the viscosity thereof. Thus, high content of chlorine is doped to the inner cladding and the core so as to decrease the germanium doping and reduce the attenuation coefficient of the fiber. It is noted that the chlorine content cannot be too high, or bubbles easily occur. Low content of chlorine is doped to the depressed outer cladding so as to decrease the fluorine doping and prevent the viscosity from being too low. For PCVD process, the chlorine content is determined by the furnace temperature and the O/Si of gas mixture, and decreases with the increase of the furnace temperature and O/Si ratio.

Advantages of the invention are summarized below: 1) the fiber of the invention comprises a functionally graded material composition and structure (as shown in FIG. 5), i.e., comprises the core, the functionally graded inner cladding, the depressed cladding, and the outer cladding; the depressed cladding is fluorine-doped silica glass, with the lowest refractive index and the lowest modulus, which improves the bending resistance, buffers the tensile stress of the fiber surface resultant from high coefficient of thermal expansion of the germanium-doped core, prevents the additional stress generated by fiber bending from passing on to the core (which causes more attenuation), and effectively improves the mechanical properties and service life of the fiber; 2) that the core and the inner cladding are fluorine- and germanium-doped silica glass ensures the fiber possesses the optical properties of G.652.D fibers; the interface viscosity of the core and the inner cladding is similar, which avoids the generation of defects in the process of fiber drawing; in the inner cladding, the amount of doped fluorine and germanium is on the increase gradually from the outer interface to the inner interface, exhibiting a gradient change (as shown in FIG. 6), which means the coefficient of expansion is on the increase gradually and prevents the generation of residual stress upon fiber drawing, further improving the mechanical properties of the fiber; and 3) the fiber of the invention meets the standards G.657.A/B and G.652.D, in comparison with conventional G.652 fibers, the fiber exhibits better compatibility, meets the requirements of network layout and apparatus miniaturization, and meanwhile can be used in long wavelength (1625-1675 nm).

DETAILED DESCRIPTION OF THE EMBODIMENTS

Figure 1:
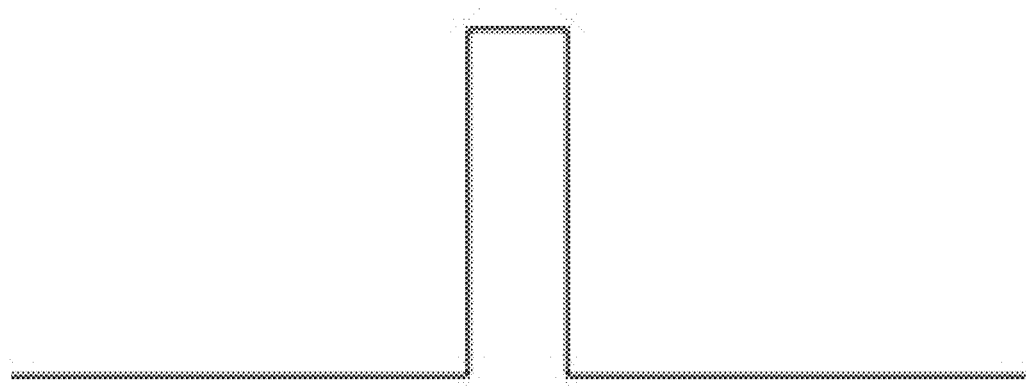
FIG. 1 is a schematic diagram of a refractive index profile of a matched-cladding fiber.
Figure 2:
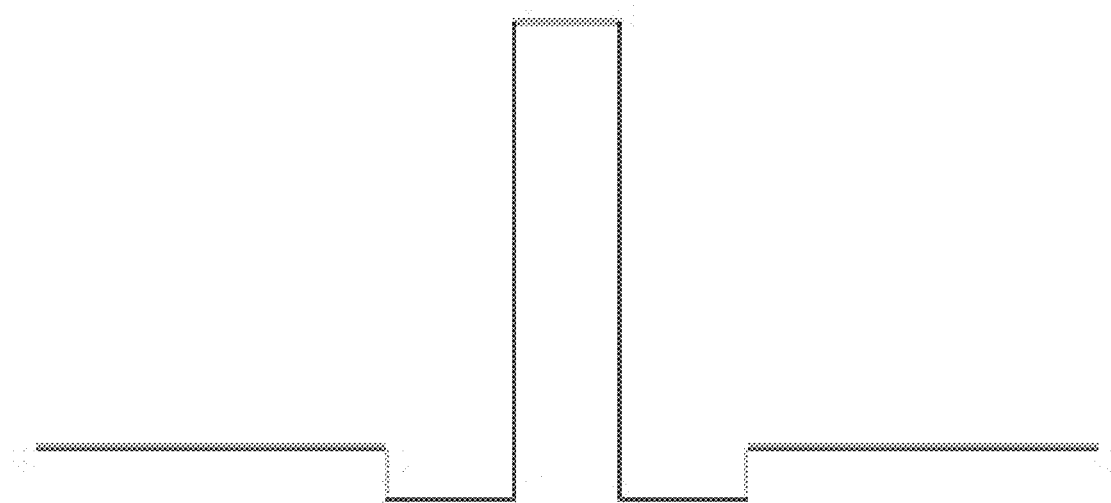
FIG. 2 is a schematic diagram of a refractive index profile of a depressed cladding fiber.
Figure 3:
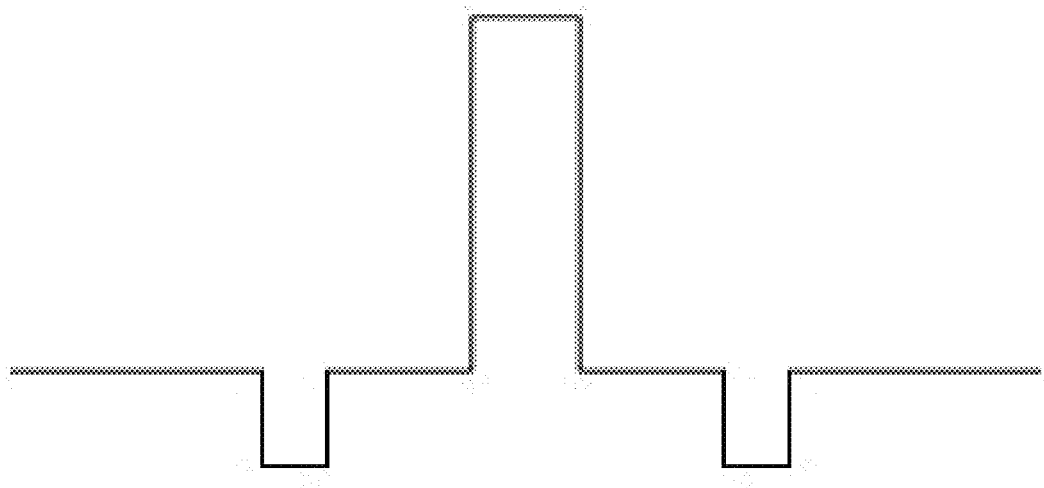
FIG. 3 is a schematic diagram of a refractive index profile of a depressed outer cladding fiber.
Figure 4:
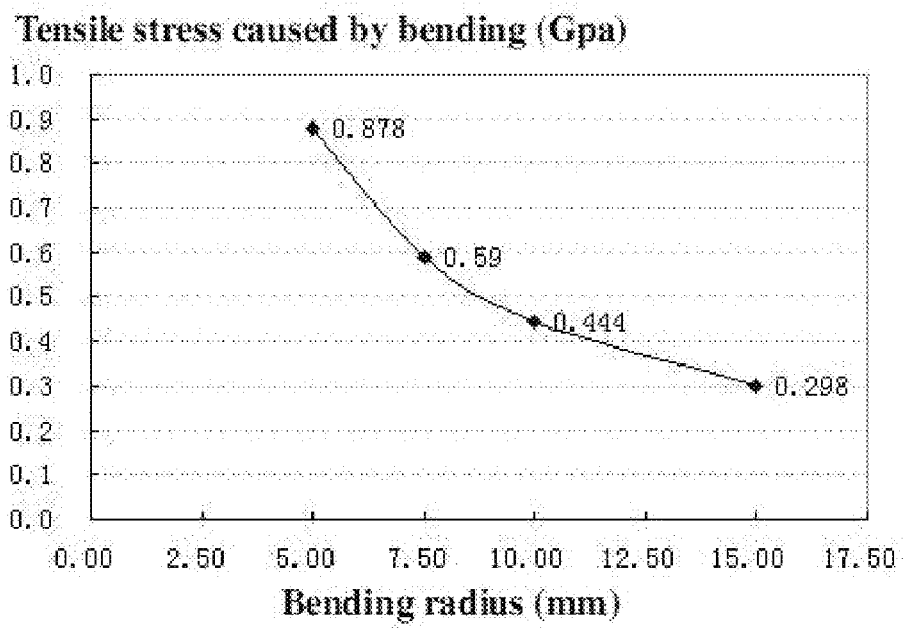
FIG. 4 is a graph of a bending radius of a fiber and the tensile stress caused thereby.
Figure 5:
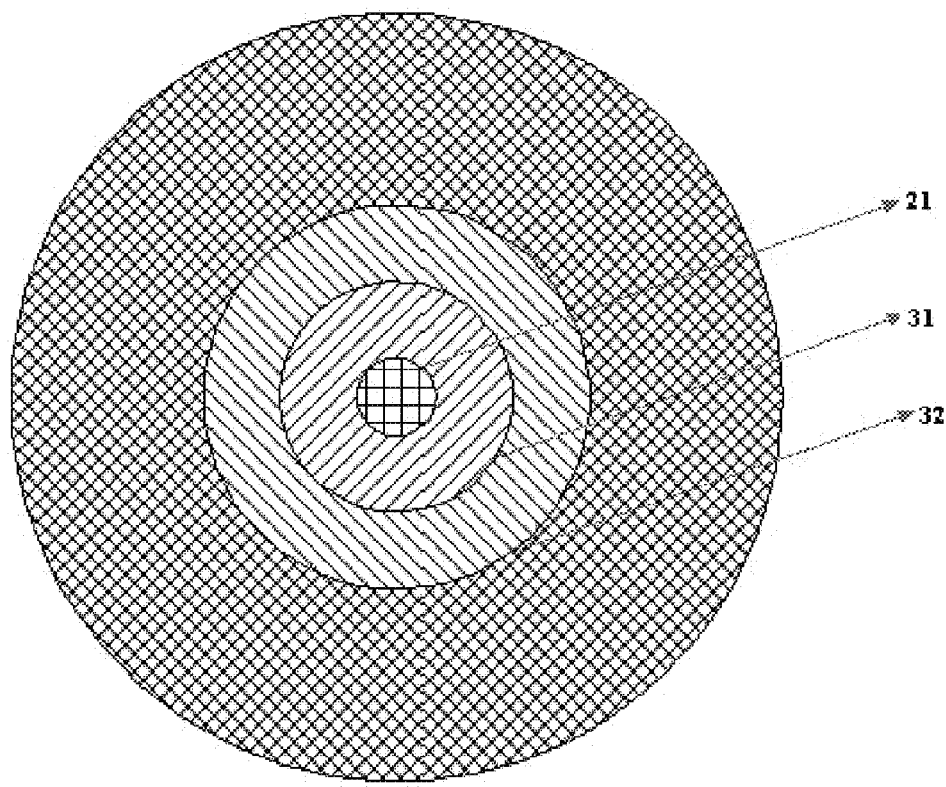
FIG. 5 is a schematic diagram of a section and a refractive index profile of a fiber according to one embodiment of the invention.
Figure 5:
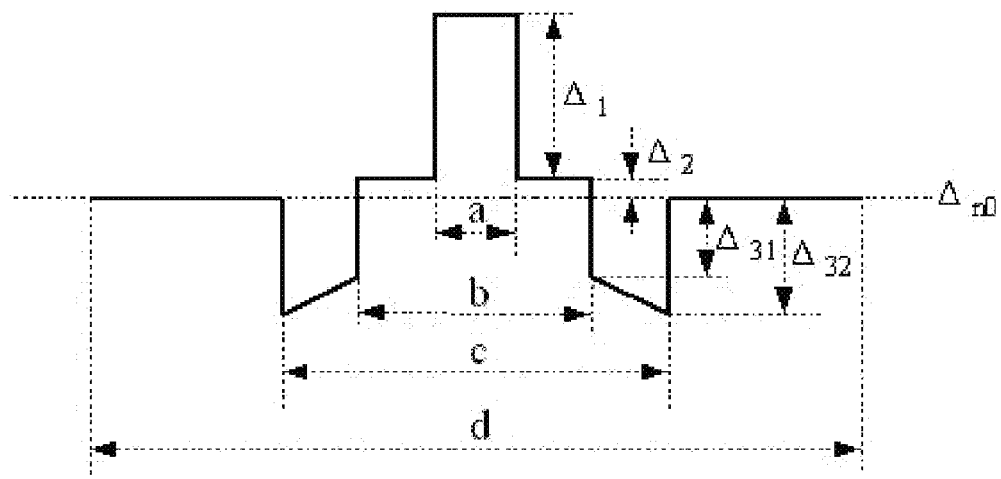
Figure 6:
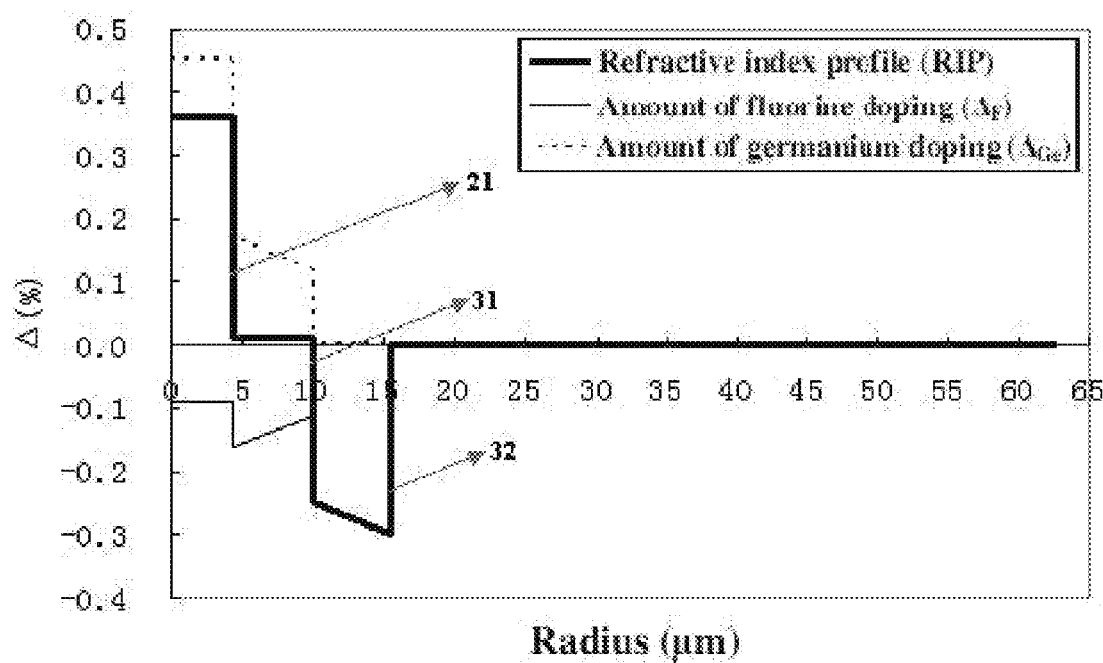
FIG. 6 is a schematic diagram of a refractive index profile and a doping profile of a fiber according to one embodiment of the invention.

Experiments for further illustrating the invention are described below.

Fluorine and germanium decrease the viscosity of fluorine- and/or germanium-doped silica glass, but the effect is different. Upon producing the identical refractive index difference by introduction of fluorine and germanium, the effect of fluorine on viscosity is thrice that of germanium. Studies (Qingrong Han et al., "Material Composition and Structure Design in PCVD Silica-based Single-Mode fiber", Proc. Of SPIE Vol. 6352 635236-1-8, for reference) show that, to make the viscosity between a core and a cladding match, the following formula should be satisfied:

$$\Delta_{F2} = \Delta_{F1} - 0.205 * \Delta_{Total}$$

wherein $\Delta F_1$ and $\Delta F_2$ represent the contribution of fluorine of the core and the inner cladding, respectively; $\Delta_{Total}$ represents the relative refractive index difference of the core in correspond to the inner cladding.

Fluorine decreases the coefficient of thermal expansion of fluorine-doped silica glass, and germanium increases the coefficient of thermal expansion of germanium-doped silica glass. The coefficient of thermal expansion $\alpha_{SiO2\text{-}GeO2\text{-}F}$ (/°C.) is calculated by the formula: $\alpha_{SiO2\text{-}GeO2\text{-}F} = (5 + 8.3\Delta_{Ge} + 2.3\Delta_F) \times 10^{-7}$.

In one embodiment, a depressed outer cladding is designed and the amount of fluorine doping is calculated accordingly. Subsequently, the amount of germanium doping of each cladding is calculated according to the refractive index profile. Following the method of the invention, a preform (80 mm) is prepared, with two layers of coatings and a drawing speed of 1,300 m/min, a single mode fiber is prepared whose structure and material composition are shown in Table 1.

TABLE 1

Structure and material composition of a fiber

| | Core | | | Inner cladding | | | |
|---|---|---|---|---|---|---|---|
| No. | Diameter a (μm) | Relative refractive index difference $\Delta_1$ (%) | The contribution of fluorine $\Delta_F$ (%) | Diameter b (μm) | Relative refractive index difference $\Delta_2$ (%) | The contribution of fluorine at the interface 21 $\Delta_F$ (%) | The contribution of fluorine at the interface 31 $\Delta_F$ (%) |
| 1 | 8.03 | 0.380 | −0.11 | 19.1 | 0.01 | −0.17 | −0.11 |
| 2 | 8.78 | 0.353 | −0.10 | 17.6 | −0.02 | −0.15 | −0.09 |
| 3 | 8.45 | 0.362 | −0.09 | 21.1 | −0.01 | −0.16 | −0.10 |
| 4 | 8.25 | 0.378 | −0.07 | 19.8 | 0.02 | −0.14 | −0.09 |
| 5 | 8.20 | 0.382 | −0.11 | 18.2 | 0.01 | −0.15 | −0.10 |
| 6 | 8.57 | 0.352 | −0.11 | 19.7 | −0.02 | −0.16 | −0.10 |

TABLE 1-continued

| | | | Structure and material composition of a fiber | | | | |
|---|---|---|---|---|---|---|---|
| 7 | 8.15 | 0.355 | −0.08 | 18.9 | 0.01 | −0.17 | −0.11 |
| 8 | 8.40 | 0.365 | −0.10 | 19.5 | 0.00 | −0.16 | −0.10 |
| 9 | 8.40 | 0.365 | −0.10 | 19.5 | 0.00 | −0.10 | −0.10 |
| 10 | 8.40 | 0.365 | −0.10 | 19.5 | 0.00 | −0.16 | −0.16 |

| | | Depressed cladding | | |
|---|---|---|---|---|
| No. | Diameter c (μm) | The contribution of fluorine at the interface 31 $\Delta_F$ (%) | The contribution of fluorine at the interface 32 $\Delta_F$ (%) | Diameter of outer cladding d (μm) |
| 1 | 26.3 | −0.25 | −0.35 | 126.0 |
| 2 | 25.8 | −0.35 | −0.35 | 100.4 |
| 3 | 36.0 | −0.24 | −0.26 | 78.1 |
| 4 | 28.2 | −0.20 | −0.32 | 123.8 |
| 5 | 26.2 | −0.30 | −0.35 | 124.7 |
| 6 | 35.7 | −0.20 | −0.28 | 125.6 |
| 7 | 34.8 | −0.20 | −0.22 | 80.8 |
| 8 | 31.0 | −0.27 | −0.30 | 125.0 |
| 9 | 31.0 | −0.27 | −0.30 | 125.0 |
| 10 | 31.0 | −0.27 | −0.30 | 125.0 |

The additional macro-bend loss is tested following the method taught by IEC 60793-1-47. The longer the wavelength, the more sensitive to bending. Thus, the test is carried out mainly at 1625 nm to assess the bending sensitiveness in the whole wavelength range (particularly L band) of the fiber. The fiber is coiled into one or ten circles with a diameter, and then the circles are loosened. The optical power before and after coiling is tested. The change is considered as the additional macro-bend loss of the fiber. To assess the mechanical properties of the fiber accurately, the strength distribution thereof must be tested with a reliable method. The fibers with big crack are removed with a screentest and those passing the test are further analyzed to assess the reliability. Following IEC60793-1-33, the dynamic stress corrosion susceptibility parameters $n_d$ of the fiber is determined using two point bend test. The method is similar to the actual application, and the results are conducive to calculating the bending radius of the fiber. The main performance parameters of the fiber are listed in Table 2.

TABLE 2

| | | | Main performance parameters of a fiber | | | | |
|---|---|---|---|---|---|---|---|
| | Mode field diameter at | Cutoff wavelength | Attenuation coefficient (dB/km) | | | | |
| No. | 1310 nm | (nm) | 1310 nm | 1383 nm | 1550 nm | 1625 nm | 1675 nm |
| 1 | 8.48 | 1246 | 0.334 | 0.307 | 0.188 | 0.201 | 0.278 |
| 2 | 9.27 | 1234 | 0.326 | 0.304 | 0.183 | 0.193 | 0.274 |
| 3 | 8.75 | 1243 | 0.337 | 0.312 | 0.191 | 0.198 | 0.283 |
| 4 | 8.61 | 1255 | 0.327 | 0.321 | 0.190 | 0.201 | 0.281 |
| 5 | 8.64 | 1247 | 0.333 | 0.301 | 0.187 | 0.199 | 0.269 |
| 6 | 9.21 | 1251 | 0.328 | 0.291 | 0.196 | 0.201 | 0.269 |
| 7 | 8.82 | 1224 | 0.338 | 0.322 | 0.198 | 0.211 | 0.282 |
| 8 | 8.81 | 1239 | 0.333 | 0.297 | 0.194 | 0.202 | 0.276 |
| 9 | 8.85 | 1228 | 0.343 | 0.312 | 0.201 | 0.214 | 0.298 |
| 10 | 8.76 | 1241 | 0.339 | 0.305 | 0.198 | 0.206 | 0.291 |

| | Additional bending loss at 1625 nm (dB/circle) | | | Zero dispersion wavelength | Zero dispersion wavelength slope | Dynamic fatigue parameters |
|---|---|---|---|---|---|---|
| No. | Φ 20 mm | Φ 15 mm | Φ 10 mm | (nm) | (ps/nm² · km) | ($n_d$) |
| 1 | 0.09 | 0.11 | 0.42 | 1308 | 0.090 | 28.2 |
| 2 | 0.07 | 0.12 | 0.23 | 1307 | 0.089 | 30.4 |
| 3 | 0.11 | 0.25 | 0.36 | 1311 | 0.090 | 29.1 |
| 4 | 0.14 | 0.28 | 0.42 | 1308 | 0.087 | 28.6 |
| 5 | 0.09 | 0.19 | 0.48 | 1310 | 0.089 | 27.4 |
| 6 | 0.08 | 0.18 | 0.38 | 1312 | 0.088 | 29.1 |
| 7 | 0.10 | 0.19 | 0.41 | 1318 | 0.086 | 30.1 |
| 8 | 0.03 | 0.10 | 0.26 | 1319 | 0.085 | 29.7 |
| 9 | 0.16 | 0.31 | 0.74 | 1316 | 0.086 | 19.2 |
| 10 | 0.12 | 0.28 | 0.57 | 1319 | 0.085 | 20.1 |

In examples of Table 1, the difference of Example 9 or 10 in contrast to Example 8 is that the former comprises an inner cladding without a functionally graded material composition and structure. Tests show that, with a functionally graded material composition and structure, the attenuation coefficient of the fiber decreases, and the dynamic fatigue parameters thereof are increased.

The invention claimed is:

1. A single mode fiber, comprising:
   a) a core,
   b) an inner cladding,
   c) a depressed cladding, and
   d) an outer cladding composed of pure silica glass,
   wherein
   said core is surrounded in sequence with said inner cladding and said depressed cladding;
   said core comprises silica glass doped with germanium and fluorine, with a diameter of 8.0-8.8 μm, a relative refractive index difference of 0.35-0.38%, and the contribution of fluoride is −0.09±0.02%;
   said inner cladding comprises silica glass doped with germanium and fluorine, with a diameter of 18-21 μm and a relative refractive index difference of 0±0.02%; and
   said depressed cladding comprises silica glass doped with fluorine, with a diameter of 26-36 μm and a relative refractive index difference $\Delta_{32}$ at the external interface thereof is between −0.22 and −0.35%, and a relative refractive index difference $\Delta_{31}$ at the internal interface thereof is between −0.20 and −0.35%, and $\Delta_{32} \leqq \Delta_{31}$.

2. The single mode fiber of claim 1, wherein in said inner cladding, the amount of doped fluorine and doped germanium is on the increase from said outer interface to said inner interface, exhibiting a gradient change; the contribution of fluorine of the outer interface of said inner cladding is −0.10±0.01%; the contribution of fluorine of the inner interface of said inner cladding is −0.16±0.01%.

3. The single mode fiber of claim 1, wherein the material composition of the silica glass doped with germanium and fluorine is $SiO_2$—$GeO_2$—F—Cl, and that of the silica glass doped with fluorine is $SiO_2$—F—Cl.

4. The single mode fiber of claim 2, wherein the material composition of the silica glass doped with germanium and fluorine is $SiO_2$—$GeO_2$—F—Cl, and that of the silica glass doped with fluorine is $SiO_2$—F—Cl.

5. The single mode fiber of claim 1, wherein said outer cladding has a diameter of 78-126 μm.

6. The single mode fiber of claim 2, wherein said outer cladding has a diameter of 78-126 μm.

7. The single mode fiber of claim 1, wherein a mode field diameter of said fiber at a wavelength of 1310 nm is 8.5-9.3 μm; a zero dispersion wavelength thereof is 1302-1322 nm; and a dispersion slope thereof at the zero dispersion wavelength is less than or equal to 0.090 ps/nm²·km.

8. The single mode fiber of claim 2, wherein a mode field diameter of said fiber at a wavelength of 1310 nm is 8.5-9.3 μm; a zero dispersion wavelength thereof is 1302-1322 nm; and a dispersion slope thereof at the zero dispersion wavelength is less than or equal to 0.090 ps/nm²·km.

9. The single mode fiber of claim 1, wherein an attenuation coefficient of said fiber at 1310 nm is less than or equal to 0.344 dB/km, at 1383 nm less than or equal to 0.334 dB/km, at 1550 nm less than or equal to 0.214 dB/km, at 1625 nm less than or equal to 0.224 dB/km, and at 1675 nm less than or equal to 0.284 dB/km.

10. The single mode fiber of claim 2, wherein an attenuation coefficient of said fiber at 1310 nm is less than or equal to 0.344 dB/km, at 1383 nm less than or equal to 0.334 dB/km, at 1550 nm less than or equal to 0.214 dB/km, at 1625 nm less than or equal to 0.224 dB/km, and at 1675 nm less than or equal to 0.284 dB/km.

11. The single mode fiber of claim 1, wherein a cutoff wavelength of said fiber is less than or equal to 1260 nm; at 1625 nm, an additional bending loss of said fiber after surrounding a 10 mm bending radius once is less than or equal to 0.2 dB; an additional bending loss of said fiber after surrounding a 7.5 mm bending radius once is less than or equal to 0.5 dB; and an additional bending loss of said fiber after surrounding a 5 mm bending radius once is less than or equal to 1.0 dB.

12. The single mode fiber of claim 2, wherein a cutoff wavelength of said fiber is less than or equal to 1260 nm; at 1625 nm, an additional bending loss of said fiber after surrounding a 10 mm bending radius once is less than or equal to 0.2 dB; an additional bending loss of said fiber after surrounding a 7.5 mm bending radius once is less than or equal to 0.5 dB; and an additional bending loss of said fiber after surrounding a 5 mm bending radius once is less than or equal to 1.0 dB.

13. A method for producing a single mode fiber, the method comprising the steps of:
   a) fixing a pure silica glass substrate tube in a plasma enhanced chemical vapor deposition lathe;
   b) in the presence of silicon tetrachloride and oxygen, aerating a fluorine-containing gas to dope fluorine and germanium tetrachloride to dope germanium;
   c) ionizing the gas in said substrate tube with microwave into plasma and depositing said plasma in the form of glass on the inner wall of said liner tube;
   d) altering the dopant gas flow according to the doping requirements of optical waveguide structure and depositing a depressed cladding, an inner cladding, and a core in sequence;
   e) melting the depositing tube into a solid core rod with a furnace;
   f) preparing a fiber preform using RIT process with silica glass as a jacketing tube, or using OVD, VAD, or APVD process by depositing an outer cladding surrounding said solid core rod; and
   g) drawing said fiber preform in a fiber drawing tower and coating two layers of UV-cured acrylic resin polymer on the surface of said fiber.

14. The method of claim 13, wherein the fluorine-containing gas is $C_2F_6$, $CF_4$, $SiF_4$, $C_4F_8$, $SF_6$, or a mixture thereof.

15. The method of claim 13, wherein in the process of depositing said depressed cladding, the furnace temperature is controlled at 1,080-1,120° C., the O/Si ratio is 3.0-3.5, and the chlorine content is less than 2,500 ppm.

16. The method of claim 14, wherein in the process of depositing said depressed cladding, the furnace temperature is controlled at 1,080-1,120° C., the O/Si ratio is 3.0-3.5, and the chlorine content is less than 2,500 ppm.

17. The method of claim 13, wherein in the process of depositing said inner cladding and said core, the furnace temperature is controlled at 1,000-1,050° C., the O/Si ratio is 2.2-2.6, and the chlorine content is 3,500-4,200 ppm.

18. The method of claim 14, wherein in the process of depositing said inner cladding and said core, the furnace temperature is controlled at 1,000-1,050° C., the O/Si ratio is 2.2-2.6, and the chlorine content is 3,500-4,200 ppm.

* * * * *